(12) United States Patent
Maruyama et al.

(10) Patent No.: US 9,847,181 B2
(45) Date of Patent: Dec. 19, 2017

(54) FILM COMPRISING SINGLE-LAYER CARBON NANOTUBES AND HAVING DENSE PORTIONS AND SPARSE PORTIONS, PROCESS FOR PRODUCING SAME, AND MATERIAL INCLUDING SAID FILM AND PROCESS FOR PRODUCING SAME

(71) Applicants: THE UNIVERSITY OF TOKYO, Tokyo (JP); SHOWA DENKO K.K., Tokyo (JP)

(72) Inventors: Shigeo Maruyama, Tokyo (JP); Shohei Chiashi, Tokyo (JP); Kehang Cui, Tokyo (JP)

(73) Assignee: THE UNIVERSITY OF TOKYO, Tokyo (JP)

( * ) Notice: Subject to any disclaimer, the term of this patent is extended or adjusted under 35 U.S.C. 154(b) by 0 days.

(21) Appl. No.: 14/771,626

(22) PCT Filed: Mar. 3, 2014

(86) PCT No.: PCT/JP2014/055275
§ 371 (c)(1),
(2) Date: Aug. 31, 2015

(87) PCT Pub. No.: WO2014/133183
PCT Pub. Date: Sep. 4, 2014

(65) Prior Publication Data
US 2016/0012975 A1    Jan. 14, 2016

(30) Foreign Application Priority Data

Mar. 1, 2013 (JP) ................................. 2013-041181

(51) Int. Cl.
*H01G 9/00* (2006.01)
*H01G 9/20* (2006.01)
(Continued)

(52) U.S. Cl.
CPC ......... *H01G 9/2045* (2013.01); *C01B 32/158* (2017.08); *C01B 32/16* (2017.08);
(Continued)

(58) Field of Classification Search
CPC ...... B82Y 40/00; B82Y 10/00; H01L 51/0048
See application file for complete search history.

(56) References Cited

U.S. PATENT DOCUMENTS

2008/0171193 A1    7/2008  Yi et al.
2008/0317660 A1*  12/2008  Pan ........................ B82Y 10/00
                                                                    423/447.2
(Continued)

FOREIGN PATENT DOCUMENTS

JP    2009-13004 A     1/2009
JP    2013-26158 A     2/2013
WO    2007/100306 A1   9/2007

OTHER PUBLICATIONS

Takamori et al., "Simple Preparation of Self-Organized Single-Walled Carbon Nanotubes with Honeycomb Structures", 2007, Advance Materials, 19, pp. 2535-2539.*
(Continued)

*Primary Examiner* — Christina Johnson
*Assistant Examiner* — Xue Liu
(74) *Attorney, Agent, or Firm* — Sughrue Mion, PLLC

(57) ABSTRACT

The present invention provides: a film that comprises single-layer carbon nanotubes having shapes which enable the characteristics thereof to be sufficiently exhibited; and a process for producing the film. The film, which comprises single-layer carbon nanotubes, has portions where single-layer carbon nanotubes are densely present and portions where single-layer carbon nanotubes are sparsely present, the dense portions forming a pseudo-honeycomb structure in a surface of the film.

4 Claims, 6 Drawing Sheets

(51) Int. Cl.

| | |
|---|---|
| H01L 51/00 | (2006.01) |
| C01B 32/158 | (2017.01) |
| C01B 32/16 | (2017.01) |
| C01B 32/162 | (2017.01) |
| H01L 51/05 | (2006.01) |
| B82Y 20/00 | (2011.01) |
| B82Y 40/00 | (2011.01) |
| B82Y 30/00 | (2011.01) |

(52) U.S. Cl.
CPC ......... C01B 32/162 (2017.08); H01G 9/2022 (2013.01); H01L 51/0048 (2013.01); *B82Y 20/00* (2013.01); *B82Y 30/00* (2013.01); *B82Y 40/00* (2013.01); *C01B 2202/02* (2013.01); *C01B 2202/08* (2013.01); *C01B 2202/34* (2013.01); *C01B 2202/36* (2013.01); *H01L 51/0545* (2013.01); *Y02E 10/542* (2013.01); *Y02E 10/549* (2013.01); *Y02P 70/521* (2015.11); *Y10S 977/751* (2013.01); *Y10S 977/843* (2013.01); *Y10S 977/846* (2013.01); *Y10S 977/948* (2013.01)

(56) References Cited

U.S. PATENT DOCUMENTS

| | | | | |
|---|---|---|---|---|
| 2010/0092809 | A1* | 4/2010 | Drzal | H01M 4/0416 |
| | | | | 429/413 |
| 2011/0262772 | A1* | 10/2011 | Hauge | B29C 43/22 |
| | | | | 428/688 |
| 2012/0279552 | A1* | 11/2012 | Crowder | B82Y 30/00 |
| | | | | 136/246 |

OTHER PUBLICATIONS

Daichi Kozawa et al., "Analysis of the Photovotaic Properties of Single-Walled Carbon Nanotube/Silicon Heterojunction Solar Cells", Applied Physics Express 2012, pp. 042304-1-042304-3, vol. 5.

Nirupama Chakrapani et al., "Capillarity-driven assembly of two-dimensional cellular carbon nanotube foams", PNAS, Mar. 23, 2004, pp. 4009-4012, vol. 101, No. 12.

Michael De Volder et al., "Diverse 3D Microarchitectures Made by Capillary Forming of Carbon Nanotubes", Adv. Mater. 2010, pp. 4384-4389, vol. 22.

Hisayoshi Takamori et al., "Simple Preparation of Self-Organized Single-Walled Carbon Nanotubes with Honeycomb Structures", Adv. Mater., Sep. 2007, pp. 2535-2539, vol. 19.

International Search Report for PCT/JP2014/055275 dated May 27, 2014.

Li, S, et al., "Super-Hydrophobicity of Large-Area Honeycomb-Like Aligned Carbon Nanotubes," J. Phys. Chem. B, Sep. 12, 2002, vol. 106, No. 36, pp. 9274-9276.

Ma, C.-Y. et al., "Patterned Carbon Nanotubes with Adjustable Array: A Functional Breath Figure Approach," Chem. Mater., Apr. 13, 2010, vol. 22. No. 7, pp. 2367-2374.

Michael, D. V. et al., "Diverse 3D Microarchitectures Made by Capillary Forming of Carbon Nanotubes," Adv. Mater., Oct. 15, 2010, vol. 22, pp. 4284-4389.

\* cited by examiner

FILM COMPRISING SINGLE-LAYER CARBON NANOTUBES AND HAVING DENSE PORTIONS AND SPARSE PORTIONS, PROCESS FOR PRODUCING SAME, AND MATERIAL INCLUDING SAID FILM AND PROCESS FOR PRODUCING SAME

CROSS REFERENCE TO RELATED APPLICATIONS

This application is a National Stage of International Application No. PCT/JP2014/055275 filed Mar. 3, 2014, claiming priority based on Japanese Patent Application No. 2013-041181 filed Mar. 1, 2013, the contents of all of which are incorporated herein by reference in their entirety.

TECHNICAL FIELD

The present invention relates to a film comprising single-walled carbon nanotubes, the film having a dense portion where the single-walled carbon nanotubes are densely present and a sparse portion where the single-walled carbon nanotubes are sparsely present; and a method for producing the film. In particular, the present invention relates to a film comprising single-walled carbon nanotubes wherein the dense portion thereof forms a pseudo-honeycomb structure in a surface of the film; and a method for producing the film.

Further, the present invention relates to a material, for example a solar cell, comprising the above-described film, and a method for producing the material.

BACKGROUND ART

Carbon nanotubes, in particular, single-walled carbon nanotubes have prominent electronic characteristics, optical characteristics, mechanical characteristics, thermal characteristics and the like, and thus, those are expected to be applied in the next-generation nano-devices.

In particular, an application to a solar cell has been expected. For example, Non-Patent Document 1 discloses a solar cell comprising an n-type Si and single-walled carbon nanotubes, and it is disclosed that the cell can provide photo conversion efficiency of 2.4%.

Further, for example, Non-Patent Document 2 relates to multi-walled carbon nanotubes, wherein when a vertically aligned multi-walled carbon nanotube film was soaked in acetone and then dried, it is confirmed by the phenomenon that the film was shrunk. Non-Patent Document 3 further developed the technology of Non-Patent Document 2, and discloses that the multi-walled carbon nanotubes can provide a fine honeycomb structure.

PRIOR ARTS

Non-Patent Documents

Non-Patent Document 1: D. Kozawa, et al., Appl. Phys. Express, 5 (2012) 042304-042306.
Non-Patent Document 2: Chakrapani, N., et al., Proc. Nat. Acad. Sci., 101, pp. 4009-4012.
Non-Patent Document 3: De Volder, et al., Adv. Mat., 22, pp. 4384-4389.

DISCLOSURE OF INVENTION

Problems to be Solved by the Invention

However, the solar cell comprising the single-walled carbon nanotube film and the n-type Si disclosed in Non-Patent Document 1 has a problem that the solar cell cannot provide sufficient efficiency, since the solar cell has lower light transmittance in the single-walled carbon nanotube film. In addition, there has been a problem in the state of contact between the n-type Si and the single-walled carbon nanotubes.

The honeycomb structure formed of the multi-walled carbon nanotube disclosed in Non-Patent Document 2 or 3 has provided no new information with regard to its application.

Accordingly, an object of the present invention is to provide a film comprising single-walled carbon nanotubes, which have the shape which can sufficiently provide the characteristics thereof; and a method for producing the film.

Further, an object of the present invention is, in addition to, or other than the above-described object, to provide a material, for example, a solar cell, comprising the above-described film.

More, an object of the present invention is, in addition to, or other than the above-described objects, to provide a method for producing a material comprising the above-described film, for example, a method for producing a solar cell comprising the above-described film.

Means for Solving the Problems

The present inventors have found the following inventions:

<1> A film comprising single-walled carbon nanotubes, wherein the film has a dense portion where the single-walled nanotubes are densely present and a sparse portion where the single-walled nanotubes are sparsely present, and the dense portion forms a pseudo-honeycomb structure on the film.

<2> In the above item <1>, the film may consist essentially of single-walled carbon nanotubes.

<3> In the above item <1>, the film may consist of single-walled carbon nanotubes.

<4> In anyone of the above items <1> to <3>, an average diameter of each of the single-walled carbon nanotubes may range from 0.7 to 3 nm, preferably from 1 to 2.5 nm, more preferably from 1.8 to 2.3 nm.

<5> In any one of the above items <1> to <4>, the dense portion may have single-walled carbon nanotubes, an axis direction of each of which is aligned vertically to the film, and a length of each of the vertically aligned single-walled carbon nanotubes may range from 1 to 100 μm, preferably from 3 to 30 μm, more preferably from 4 to 8 μm.

<6> In any one of the above items <1> to <5>, the sparse portion may consist essentially of single-walled carbon nanotubes, an axis direction of each of which is disposed horizontally to the film.

<7> In any one of the above items <1> to <6>, an average length of one side of each hexagon of the pseudo-honeycomb structure may range from 1 to 100 μm, preferably from 3 to 30 μm, more preferably from 5 to 15 μm.

<8> A material comprising the film according to anyone of the above items <1> to <7>.

<9> A solar cell comprising the film according to any one of the above items <1> to <7>.

<10> A method for producing a film comprising single-walled carbon nanotubes, the film comprising a dense portion where the single-walled carbon nanotubes are densely present and a sparse portion where the single-walled carbon nanotubes are sparsely present, the method comprising the steps of:

A) preparing a layer comprising vertically aligned single-walled carbon nanotubes formed on a substrate; and B) exposing a surface of the layer comprising the single-walled carbon nanotubes to at least one vapor selected from the group consisting of water and lower alcohols, to form the dense portion where the single-walled carbon nanotubes are densely present and the sparse portion where the single-walled carbon nanotubes are sparsely present, therefrom by the dense portion to form a pseudo-honeycomb structure on the layer comprising the single-walled carbon nanotubes.

<11> In the above item <10>, the method may further comprise a step of C) soaking a resultant one in the step (B) in water at a temperature of 60 to 100° C., preferably 70 to 90° C., more preferably at a temperature of 80° C., to release the layer comprising the single-walled carbon nanotubes from the substrate, thereby to form the film from the released layer.

<12> In the above item <10> or <11>, the layer comprising the single-walled carbon nanotubes and the film may consist essentially of single-walled carbon nanotubes.

<13> In the above item <10> or <11>, the layer comprising the single-walled carbon nanotubes and the film may consist of single-walled carbon nanotubes.

<14> In any one of the above items <10> to <13>, an average diameter of each of the single-walled carbon nanotubes may range from 0.7 to 3 nm, preferably from 1 to 2.5 nm, more preferably from 1.8 to 2.3 nm.

<15> In the step A) of any one of the above items <10> to <14>, a length of each of the single-walled carbon nanotubes in the layer comprising the vertically aligned single-walled carbon nanotubes may range from 1 to 100 μm, preferably from 3 to 30 μm, more preferably from 4 to 8 μm.

<16> In any one of the above items <10> to <15>, the dense portion may have single-walled carbon nanotubes, an axis direction of each of which is aligned vertically to the film.

<17> In any one of the above items <10> to <16>, the sparse portion may consist essentially of single-walled carbon nanotubes, an axis direction of each of which is disposed horizontally to the film.

<18> In any one of the above items <1> to <17>, an average length of one side of each hexagon of the pseudo-honeycomb structure may range from 1 to 100 μm, preferably from 3 to 30 μm, more preferably from 5 to 15 μm.

<19> A method for producing a material having a film comprising single-walled carbon nanotubes, the film comprising a dense portion where single-walled carbon nanotubes are densely present and a sparse portion where single-walled carbon nanotubes are sparsely present, the method comprising the steps of:

A) preparing a layer comprising vertically aligned single-walled carbon nanotubes formed on a substrate;

B) exposing a surface of the layer comprising the single-walled carbon nanotubes to at least one vapor selected from the group consisting of water and lower alcohols, to form the dense portion where single-walled carbon nanotubes are densely present and the sparse portion where single-walled carbon nanotubes are sparsely present, therefrom by the dense portion to form a pseudo-honeycomb structure on the layer comprising the single-walled carbon nanotubes;

C) soaking a resultant one in the step B) in water at a temperature of 60 to 100° C., preferably 70 to 90° C., more preferably at a temperature of 80° C., to release the layer comprising the single-walled carbon nanotubes from the substrate, thereby to form the film from the released layer; and D) disposing the resultant film in the step C) in a predetermined position.

<20> In the above item. <19>, the material may be a solar cell.

<21> In the above item <19> or <20>, the layer comprising the single-walled carbon nanotubes and the film may consist essentially of single-walled carbon nanotubes.

<22> In the above item <19> or <20>, the layer comprising the single-walled carbon nanotubes and the film may consist of single-walled carbon nanotubes.

<23> In any one of the above items <19> to <22>, an average diameter of each of the single-walled carbon nanotubes may range from 0.7 to 3 nm, preferably from 1 to 2.5 nm, more preferably from 1.8 to 2.3 nm.

<24> In the step A) of any one of the above items <19> to <23>, a length of each of the single-walled carbon nanotubes in the layer comprising the vertically aligned single-walled carbon nanotubes may range from 1 to 100 μm, preferably from 3 to 30 μm, more preferably from 4 to 8 μm.

<25> In any one of the above items <19> to <24>, the dense portion may have single-walled carbon nanotubes, an axis direction of each of which is aligned vertically to the film.

<26> In any one of the above items <19> to <25>, the sparse portion may consist essentially of single-walled carbon nanotubes, an axis direction of each of which is disposed horizontally to the film.

<27> In any one of the above items <19> to <26>, an average length of one side of each hexagon of the pseudo-honeycomb structure may range from 1 to 100 μm, preferably from 3 to 30 μm, more preferably from 5 to 15 μm.

Effects of the Invention

The present invention can provide a film comprising single-walled nanotubes, which have the shape which can sufficiently provide the characteristics thereof; and a method for producing the above-described film.

Further, the present invention can provide, in addition to or other than the above effect, a material, for example, a solar cell, comprising the above-described film.

More, the present invention can provide, in addition to or other than the above effects, a method for producing a material comprising the above-described film, for example, a method for producing a solar cell comprising the above-described film.

EMBODIMENTS FOR CARRYING OUT THE INVENTION

The invention disclosed in the present application will be described in detail hereinafter.

<Film>

The present invention discloses a film comprising single-walled carbon nanotubes and the film having a dense portion where the single-walled carbon nanotubes are densely present and a sparse portion where the single-walled carbon nanotubes are sparsely present.

The film according to the present invention comprises single-walled carbon nanotubes.

Preferably, the film according to the present invention may consist essentially of single-walled carbon nanotubes. The phrase "consists essentially of" used herein means that the film consists of single-walled carbon nanotubes but it may contain a substance not adversely affecting the configuration of the film. For example, the film may contain a small amount of a few-walled carbon nanotube, a polymer, a fullerene, and the like. In addition, a doping substance, which does not adversely affecting the film configuration itself while does increase the photo conversion efficiency of the solar cell which will be discussed later, such as for example, $HNO_3$ may be contained therein.

Preferably, the film according to the present invention may consist of single-walled carbon nanotubes.

The dense portion and the sparse portion of the single-walled carbon nanotubes mean the portions where single-walled carbon nanotubes are densely and sparsely present in a relative sense to each other. In particular, in the film according to the present invention, the dense portion forms a pseudo-honeycomb structure on a surface of the film, or more specifically the dense portion forms the frame portion of the pseudo-honeycomb structure. The dense portion or the frame portion of the pseudo-honeycomb structure may be continuous in the film. On the other hand, the sparse portion does not constitute the frame of the pseudo-honeycomb structure but the inner portion of the frame. Since the sparse portion is inside the frame, contrary to the dense portion, the sparse portion is not continuous in the film. Accordingly, the dense portion and the sparse portion can be clearly distinguished even though they are expressed in a relative way.

The term "the pseudo-honeycomb structure" used herein encompasses the honeycomb structure which contains a plurality of the hexagons formed in a certain plane, and the structure which contains distorted shapes of the hexagons.

Each shape of the hexagons or the pseudo-hexagons, which constitute the pseudo-honeycomb structure, has an average length of one side of the hexagon of 1 to 100 µm, preferably 3 to 30 µm, more preferably 5 to 15 µm.

The film comprising single-walled carbon nanotubes according to the present invention will be described by referring drawings.

Figure 1:
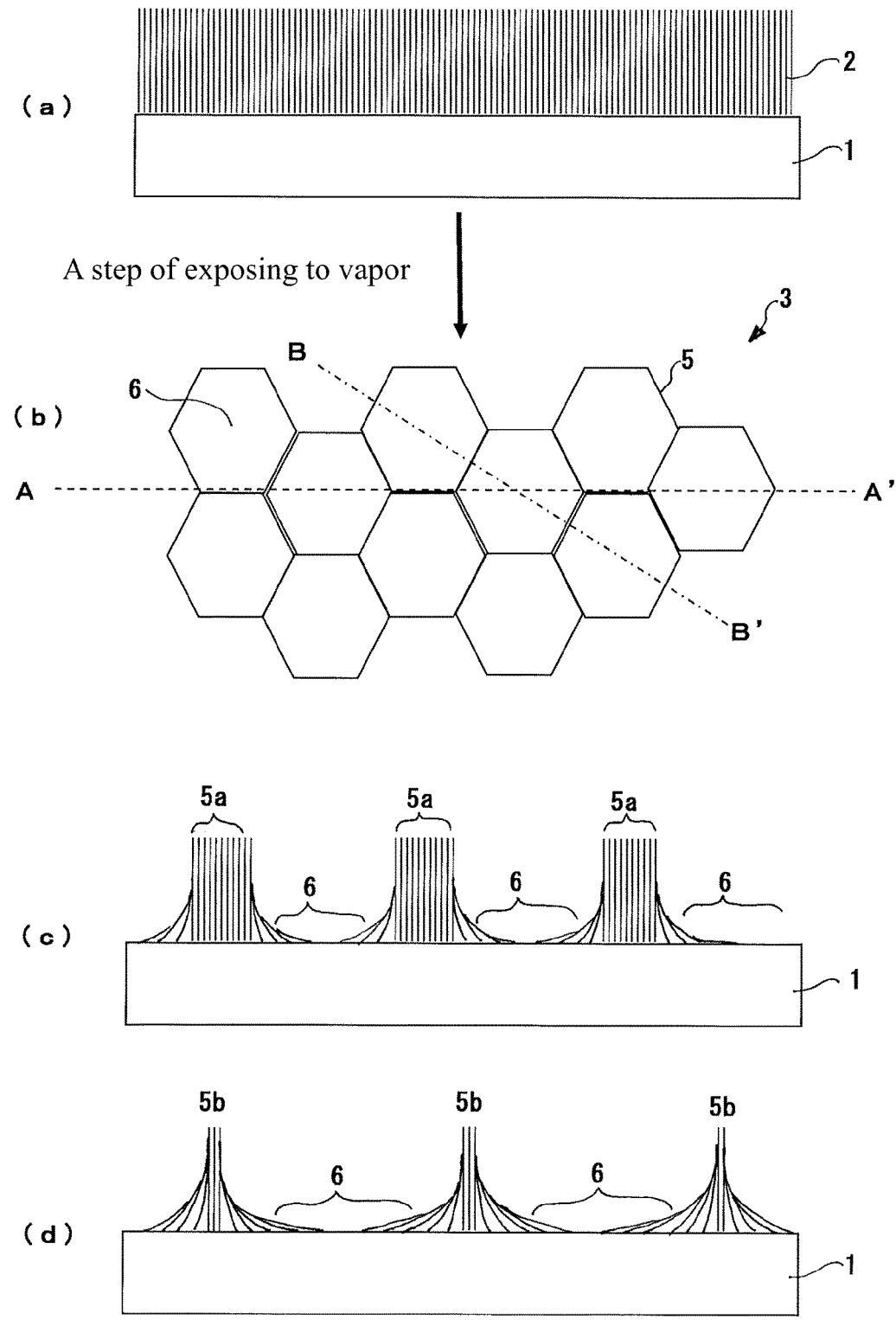
FIG. 1 shows the schematic views of the film comprising single-walled carbon nanotubes according to the present invention: (b) a top view; (c) an A-A' cross-section view of the top view (b); and (d) a B-B' cross-section view of the top view (b).

FIG. 1 shows the schematic views of the film comprising single-walled carbon nanotubes according to the present invention: (b) a top view; (c) an A-A' cross-section view of the top view (b); and (d) a B-B' cross-section view of the top view (b).

FIG. 1(a) shows the vertically aligned single-walled carbon nanotubes prepared before the step of exposing to vapor which will be later explained in detail, namely this shows the vertically aligned single-walled carbon nanotubes 2 formed on the substrate 1.

The vertically aligned single-walled carbon nanotubes 2 can be exposed to a vapor of a predetermined solvent, to form the film 3 comprising the pseudo-honeycomb structure 5 as shown in FIG. 1(b). Furthermore, FIG. 1(b) is the top view of the film obtained after the step of exposing to vapor.

As shown in FIG. 1(b), the single-walled carbon nanotube dense portion 5 and the single-walled carbon nanotube sparse portion 6 are formed.

The schematic view of the A-A' cross-section of FIG. 1(b) is shown in FIG. 1(c). The dense portion 5a of FIG. 1(c) corresponds to one side of each of the hexagons of the pseudo-honeycomb structure 5 discussed above. And the schematic view of the B-B' cross-section of FIG. 1(b) is shown in FIG. 1(d). The dense portion 5b of FIG. 1(d) corresponds to the cross-section view of the portion 5a, viewed from a vertical direction (vertical to the paper). It shows that the single-walled carbon nanotubes are densely present.

The single-walled carbon nanotubes, which constitute the film according to the present invention may have an average diameter of 0.7 to 3 nm, preferably 1 to 2.5 nm, more preferably 1.8 to 2.3 nm.

The dense portion comprises single-walled carbon nanotubes, an axis direction of each of which is aligned vertically to the film wherein a length of the vertically aligned single-walled carbon tube may range from 1 to 100 µm, preferably 3 to 30 µm, more preferably 4 to 8 µm.

The sparse portion may comprise single-walled carbon nanotubes, an axis direction of each of which is disposed horizontally to the film; and preferably the sparse portion may consist essentially of single-walled carbon nanotubes disposed horizontally as mentioned above. The single-walled carbon nanotubes, which constitute the sparse portion, may be, but are not limited to, same as the single-walled carbon nanotubes, which constitute the dense portion. A length of each of the single-walled carbon nanotubes, which constitute the sparse portion, may range from 1 to 100 µm, preferably 3 to 30 µm, more preferably 4 to 8 µm.

The film according to the present invention, which has the constitution as mentioned above, can provide an excellent electric conductivity by the dense portion, and high transmittance, for example, high transmittance in the wavelength range of 200 to 1600 nm, by the sparse portion. Furthermore, in a case where the film according to the present invention is disposed on a certain substrate such as a solar cell or the like that will be discussed later, the sparse portion can show a good contact with the substrate. In other words, since the single-walled carbon nanotubes, an axis direction of each of which is disposed horizontally to the film, contact with the substrate, a larger number of the single-walled carbon nanotubes can contact directly with the substrate.

Such film can be applied to, but is not limited to, various materials such as an electronic device, an optical device, a magnetic device and the like. More specifically, the film can be applied to, but is not limited to, a solar cell, a transparent electrode, a transparent electrically conductive film and the like.

Figure 6:
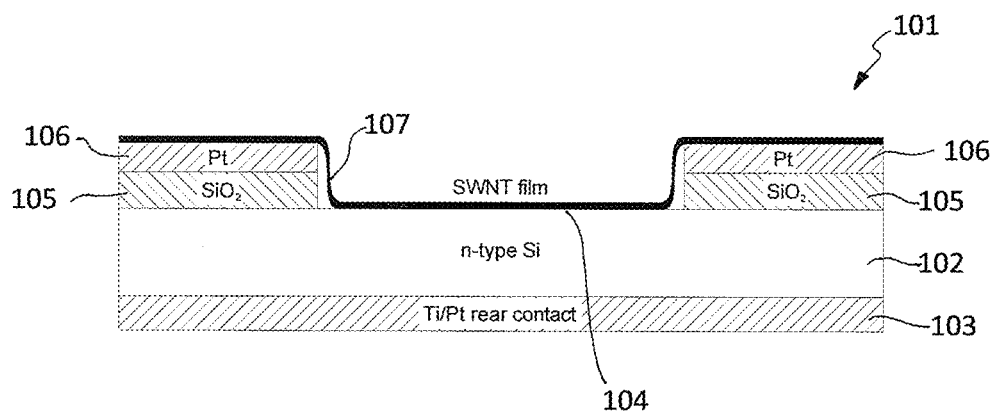
FIG. 6 shows the schematic cross-section view of the solar cell 101 prepared in Example 5.

If the film is used in a solar cell, for example, contacting the film according to the present invention with the n-type silicon can form a heterojunction solar cell. For example, the solar cell can be configured as shown in FIG. 6, to function as the solar cell by receiving a solar light from the upper side of FIG. 6, which will be described in detail in Examples.

Figure 9:
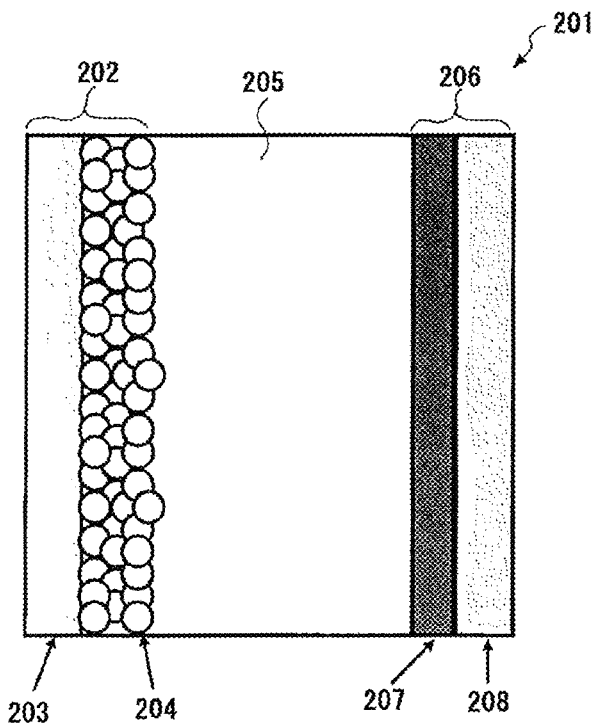
FIG. 9 shows the schematic cross-section view of the dye-sensitized solar cell 201 prepared in Example 10.

Further, for example, the film according to the present invention can be used as a part of a counter electrode as shown in FIG. 9, to function as a dye-sensitized solar cell, which will be also described in detail in Examples.

<Method for Producing the Film>

The film according to the present invention can be produced, for example, by a method described below:

The method comprising the steps of:

A) preparing a layer comprising vertically aligned single-walled carbon nanotubes formed on a substrate; and B) exposing a surface of the layer comprising the vertically aligned single-walled carbon nanotubes to at least one vapor selected from the group consisting of water and lower alcohols, to form a dense portion where single-walled carbon nanotubes are densely present and a sparse portion where single-walled carbon nanotubes are sparsely present, therefrom by the dense portion to form a pseudo-honeycomb structure on the layer comprising single-walled carbon nanotubes; To obtain the film according to the present invention, namely, the layer comprising single-walled carbon nanotubes thus obtained, whereby corresponding to the film.

Furthermore, the terms "single-walled carbon nanotube", "dense portion", "sparse portion", and "pseudo-honeycomb structure" each has the same definition as mentioned before.

Further, if necessary, the method may comprise a step of soaking the film obtained in the step B), namely the film formed on the substrate, in water at a temperature of 60 to 100° C., preferably 70 to 90° C., more preferably at 80° C., to release the film from the substrate.

More, after the step of releasing, the method may comprise a step of cleaning the film and a step of drying the resultant film.

The step A) is a step of preparing the layer comprising the vertically aligned single-walled carbon nanotubes formed on the substrate. The step is not particularly restricted so far as it is the step of preparing the layer comprising the vertically aligned single-walled carbon nanotubes formed on the substrate. Illustrative example of the step may be, but is not limited to, the method which was researched and developed by a part of the present inventors, specifically the alcohol catalytic CVD method (ACCVD) which is disclosed in WO2003/068676.

A length of each of single-walled carbon nanotubes in the layer comprising the vertically aligned single-walled carbon nanotubes to be formed in the present step may be, depending on the intended film, for example, 1 to 100 μm, preferably 3 to 30 μm, more preferably 4 to 8 μm.

The layer comprising the vertically aligned single-walled carbon nanotubes to be formed in the present step becomes the film according to the present invention as a result. Accordingly, the layer comprising the vertically aligned single-walled carbon nanotubes may consist essentially of single-walled carbon nanotubes, similar to the film mentioned above. Preferably, it consists of single-walled carbon nanotubes.

Hereinafter, the ACCVD method will be explained in due order, but is not limited thereto.

Firstly, the substrate is prepared.

The substrate may be conventionally known one such as a silicon, a quartz, a crystal, and a sapphire, these having $SiO_2$ on the surface thereof.

If necessary, the substrate may be subjected to various cleaning step and/or burning step before the step B). Furthermore, conventionally known methods may be used for the cleaning step and the burning step. Examples of the cleaning step may include, are not limited to, a temperature-elevating burning cleaning process, a cleaning process by an aqueous ammonia and hydrogen peroxide, an $O_2$ plasma cleaning process, a cleaning process by a strong acid (such as sulfuric acid, and sulfuric acid and $KMnO_4$), an UV excimer cleaning process, a low-pressure mercury lamp cleaning process, an alkaline cleaning process, an ultrasonic cleaning process, a megasonic cleaning process, a corona treating process, a glow cleaning process, a scrubbing cleaning process, an ozone cleaning process, a hydrogen water cleaning process, a micro-bubbling cleaning process, and a fluorine-based cleaning process, depending on the substrate to be used, depending on the catalyst to be used thereafter or the like.

Then, a catalyst is formed on the substrate. For example, the catalyst can be formed on the substrate by applying a catalyst-containing solution onto the substrate.

The catalyst-containing solution may comprise, depending on the substrate to be used, depending on the solvent to be used or the like, a salt of at least one metal selected from the group consisting of Fe, Co, Ni and Mo.

In particular, the catalyst-containing solution may be a solution containing a salt of only Co, a solution containing a salt or salts of Co and Mo, a solution containing a salt or salts of Fe and Co, a solution containing a salt or salts of Fe and Ni, or a solution containing a salt or salts of Ni and Co. Preferably, the catalyst-containing solution may be a solution containing a salt of only Co, or a solution containing a salt or salts of Co and Mo.

The salt or salts may be an acetate salt, a nitrate salt, a chloride salt, or an ammonium salt. The salt or salts may be, for example, cobalt acetate, molybdenum acetate, or ammonium dimolibdate ($(NH_4)_2Mo_2O_7$).

A solvent of the catalyst-containing solution may be a lower alcohol which can dissolve the above-described salt or salts, such as for example, methanol, ethanol or propanol, preferably ethanol.

Preferably, the catalyst-containing solution may be a solution of cobalt acetate in ethanol, or both of a solution of cobalt acetate in ethanol and a solution of molybdenum acetate in ethanol. When both of the solution of cobalt acetate in ethanol and the solution of molybdenum acetate in ethanol are used, it is preferable that the solution of molybdenum acetate in ethanol is applied, followed by drying thereof, and then the solution of cobalt acetate in ethanol is applied.

The application process of the catalyst-containing solution may be one of various conventionally known methods. Examples of the application process may include, but are not limited to, a dip coating process, a spin coating process, a cast coating process, a spray coating process and the like.

Then, on the resultant substrate having the catalyst thereon, vertically aligned carbon nanotubes are formed in the presence of a carbon source by the ACCVD method. For example, this process may be carried out by the method disclosed in Patent Document 1 (WO2003/068676) or in Patent Document 2 (US2006/0024227 A1), whole contents of which are incorporated herein by reference.

The carbon source may be one of conventionally known carbon sources. Specifically, the carbon source may be selected from the group consisting of lower alcohols and ethers. Preferably, the carbon source may be methanol, ethanol, propanol, dimethyl ether or diethyl ether. More preferably, the carbon source may be ethanol or dimethyl ether.

Alternatively, the carbon source may be, other than the above-described carbon sources, a nitrogen-containing carbon source. Use of the nitrogen-containing carbon source can control a diameter of each of the resultant vertically aligned single-walled carbon nanotubes. The nitrogen-containing carbon source may be, for example, at least one selected from the group consisting of an ammonia-containing carbon source, an acetonitrile-containing carbon source, and a benzylamine-containing carbon source. Preferably, the nitrogen-containing carbon source may be acetonitrile-containing carbon source.

The ammonia-containing carbon source may use a conventionally known carbon source as the carbon source. And, an amount of ammonia in the ammonia-containing carbon source may be up to 5% by volume, preferably 1% by volume, based on 100% by volume of entirety of the ammonia-containing carbon source.

The acetonitrile-containing carbon source may consist of acetonitrile, or may also comprise the conventionally known carbon sources as mentioned above. That is, the acetonitrile-containing carbon source may comprise the conventionally-known carbon sources as mentioned above, wherein an amount of acetonitrile may be more than 0% to 100% by volume, preferably 0.1 to 10% by volume, more preferably 1 to 6% by volume, based on 100% by volume of entirety of the acetonitrile-containing carbon source.

The benzylamine-containing carbon source may consist of benzylamine, or may also comprise the conventionally known carbon source as mentioned above. That is, the benzylamine-containing carbon source may comprise the conventionally known carbon sources as mentioned above, wherein an amount of benzylamine may be more than 0% to 100% by volume, preferably 0.1 to 10% by volume, more preferably 1 to 5% by volume, based on 100% by volume of entirety of the benzylamine-containing carbon source.

The ACCVD method may be carried out under reduced pressure, preferably at 3 kPa or lower, more preferably 1.3 kPa or lower, at a temperature of 500° C. or higher, preferably 700° C. or higher, more preferably at 800° C.

In the step A), the nanoscale and/or microscale of the single-walled carbon nanotubes may be controlled by changing, for example, the concentrations of the Co/Mo acetate solution and the carbon source, as well as the condition of the substrate and the condition of the CVD.

For example, with regard to the nanoscale, a diameter of each of single-walled carbon nanotubes can be controlled in the range of 2.2 to 1.4 nm, to change the band gap of the single-walled carbon nanotubes significantly (see R. Xiang*, E. Einarsson, Y. Murakami, J. Shiomi, S. Chiashi, Z.-K. Tang, S. Maruyama*, "Diameter Modulation of Vertically Aligned Single-Walled Carbon Nanotubes", ACS Nano, (2012), 6, (8), 7472-7479).

Further, by adding acetonitrile to ethanol as the carbon source, a diameter of each of nanotubes can be changed in the range of 2.1 to 0.7 nm (see, T. Thurakitseree, C. Kramberger, P. Zhao, S. Aikawa, S. Harish, S. Chiashi, E. Einarsson, S. Maruyama*, "Diameter-Controlled and Nitrogen-Doped Vertically Aligned Single-Walled Carbon Nanotubes", Carbon, (2012), 50, (7), 2635-2640).

More, with regard to the microscale, the vertically aligned single-walled carbon nanotube can be grown in a patterned way with high precision by changing hydrophobicity of the substrate surface (see, R. Xiang, T. Wu, E. Einarsson, Y. Suzuki, Y. Murakami, J. Shiomi, S. Maruyama*, "High-Precision Selective Deposition of Catalyst for Facile Localized Growth of Single Walled Carbon Nanotubes", J. Am. Chem. Soc., (2009), 131, (30), 10344-10345).

The step B) is a step of exposing a surface of the layer, obtained in the step A), comprising the vertically aligned single-walled carbon nanotubes, to the above-described vapor.

The solvent may be, depending on the characteristics of the layer comprising the vertically aligned carbon nanotubes to be used (for example, the total size, the length and the diameter of each of the vertically aligned carbon nanotubes, and the like), the structure of the film to be obtained, and the like, at least one selected from the group consisting of water and lower alcohols. Preferably, the solvent may be selected from the group consisting of water, methanol and ethanol, more preferably water or ethanol.

A temperature of the solvent to be used may be, depending on the characteristics of the layer comprising the vertically aligned carbon nanotubes to be used (for example, the total size, the length and the diameter of each of the vertically aligned carbon nanotubes, and the like), the structure of the film to be obtained, and the like, from 30 to 90° C., preferably 50 to 85° C.

The time for the exposure may be, depending on the characteristics of the layer comprising the vertically aligned carbon nanotubes to be used (for example, the total size, the length and the diameter of each of the vertically aligned carbon nanotubes, and the like), the structure of the film to be obtained, and the like, from 1 to 20 seconds, preferably 1 to 10 seconds.

In a case where, for example, the film thickness (height or length of the single-walled carbon nanotubes), one of the characteristics of the layer comprising the vertically aligned carbon nanotube to be used, is 20 µm or more, the solvent may be ethanol, and a temperature of the solvent may range from 30 to 80° C., preferably 50 to 70° C., and the time for the exposure may be from 1 to 10 seconds, preferably 1 to 3 seconds.

In the exposure step, the dense portion and the sparse portion of the single-walled carbon nanotubes are formed, and also the pseudo-honeycomb structure is formed by the dense portion in the layer comprising single-walled carbon nanotubes.

The method for producing the film according to the present invention may comprise, after the step B), a step of releasing the film from the substrate. That is, the method may comprise a step of releasing the layer comprising the single-walled carbon nanotubes from the substrate by soaking the one obtained in the step B) in water at a temperature of 60 to 100° C., preferably 70 to 90° C., more preferably at 80° C.

For the step of releasing, for example, one may use the method described in Japan Patent No. 4374456, whole contents of which are incorporated herein by reference.

The film obtained in the step of releasing can be disposed in an intended position, to provide an intended material. For example, as discussed before, if the film obtained in the step of releasing is disposed on the n-type Si in the intended state, a heterojunction solar cell may be provided. Similarly, one can provide a dye-sensitized solar cell as well. Further, if the film is disposed on a polyethylene terephthalate (PET) substrate, one can provide a flexible, transparent, electrically conductive film; and if the film is disposed on a glass substrate, one can provide a transparent, electrically conductive substrate.

Hereinafter, the present invention will be illustrated in detail by, but is not limited to, the following Examples.

Example 1

<Synthesis of the Vertically Aligned SWNT>
<<a. Substrate>>

The Si/SiO$_2$ substrate (size of 25 mm×100 mm×0.6 mm) prepared in a manner same as the method described in JP-A No. 2010-202422 was used. Specifically, after it was heated in an air at 500° C. for 5 minutes to remove impurities on the surface thereof, the subsequent steps were carried out.

<<b. A Step of Applying Catalyst>>

The Co/Mo catalyst was applied on the Si/SiO$_2$ substrate obtained in the above-described step in a dip coating process in a manner similar to one described in JP-A No. 2010-202422.

Specifically, the dip coating process was carried out in the two-step process. At first, the substrate was soaked in a solution of molybdenum acetate in ethanol at the concentration of 0.01% by weight for 0 to 10 minutes; and then, it was pulled up at the rate of 4 cm/minute by using a motor. After it was dried (usually within 10 seconds), it was baked in an air at 400° C. for 5 minutes.

Then, the substrate thus obtained was soaked in a solution of molybdenum acetate in ethanol at the concentration of 0.01% by weight for 5 minutes; and then, it was pulled up at the rate of 4 cm/minute by using a motor. After it was dried (usually within 10 seconds), it was baked in an air at 400° C. for 5 minutes, to obtain the substrate having the catalyst supported thereon.

<<c. A Step of Forming Vertically Aligned SWNTs>>

The substrate having the catalyst supported thereon, obtained as mentioned above, was used to synthesize vertically aligned single-walled carbon nanotubes (hereafter, the single-walled carbon nanotubes are sometimes referred to as simply "SWNTs"; and the vertically aligned single-walled carbon nanotubes are sometimes referred to as simply "VA-SWNTs") by the standard alcohol-catalyzed chemical gas phase vapor deposition method (ACCVD; Alcohol Catalytic CVD) (for example, see JP-A No. 2010-202422).

Specifically, the substrate having the catalyst supported thereon, obtained as mentioned above, was placed in a quartz tube surrounded by an electric furnace; and then, it was heated gradually up to 800° C. over 30 minutes. Then, after the substrate was kept at 800° C. for 10 minutes, ethanol was introduced thereinto as the carbon source at the pressure of 1.3 kPa with the flow rate of 100 sccm, to obtain carbon nanotubes on the substrate.

Figure 2:
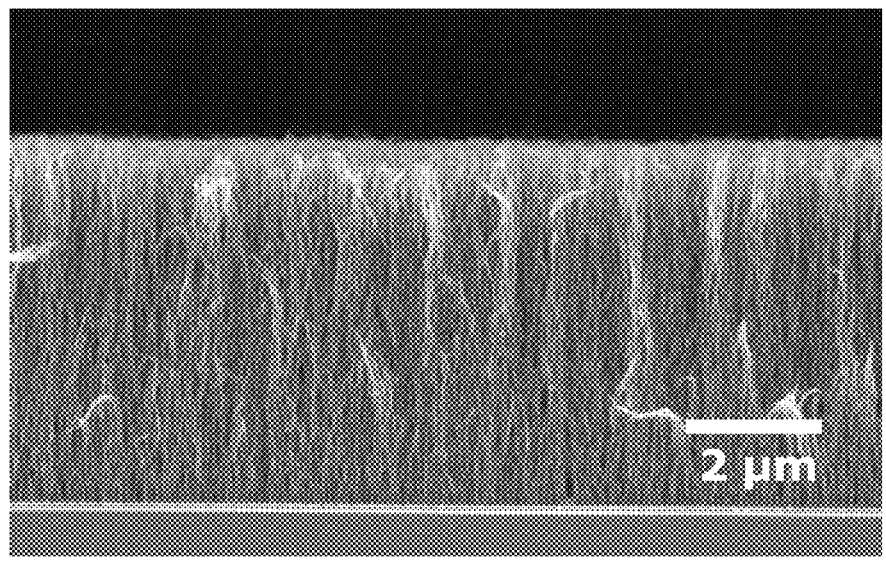
FIG. 2 shows a SEM image of the vertically aligned single-walled carbon nanotubes obtained in the step c of Example 1.
Figure 4:
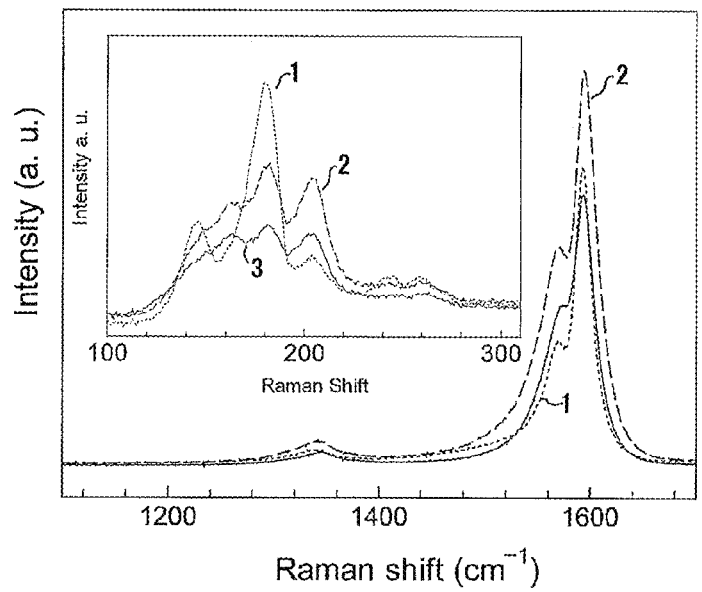
FIG. 4 shows graphs illustrating the Raman spectroscopic analysis results of the vertically aligned single-walled carbon nanotube obtained in the step c of Example 1 (shown by the dotted line [1] in the figure), the portion where the single-walled carbon nanotube film obtained in Example 1 is densely present (the portion shown in [2] of FIG. 3, and shown by the dashed line [2] in FIG. 4), and the portion where the single-walled carbon nanotube film obtained in Example 1 is sparsely present (the portion shown in [3] of FIG. 3, and shown by the solid line [3] in FIG. 4).

The carbon nanotubes thus obtained were determined by the scanning electron microscope (SEM) (S-4800, manufactured by Hitachi, Ltd., the acceleration voltage: 1 kV) and the Raman spectroscopic analysis. FIG. 2 shows the SEM images thereof. In FIG. 4, the dotted line [1] shows the Raman spectroscopic analysis results of the carbon nanotubes obtained here.

These results show that the carbon nanotubes thus obtained are highly pure SWNTs each having an average diameter of 2.2 nm and a growth height of 5 μm. That is, it can be seen that the highly purity VA-SWNTs each having the average diameter of 2.2 nm and the growth height of 5 μm is formed on the substrate in the present step.

<<d. A Step of Exposing to Vapor>>

The surface formed with the VA-SWNTs thus obtained was exposed to water vapor.

Specifically, a beaker containing therein water heated at 80° C. was prepared, and the surface formed with the VA-SWNT was placed on the beaker; specifically it was disposed at 5 mm above the water and kept there for about 5 seconds. After exposure to the vapor, the VA-SWNTs were put with the surface side being upward, to dry them.

The dried VA-SWNTs obtained after exposure to the vapor were visually almost transparent with a slightly blue color. This is probably due to formation of the pseudo-honeycomb structure which will be discussed later.

Figure 3:
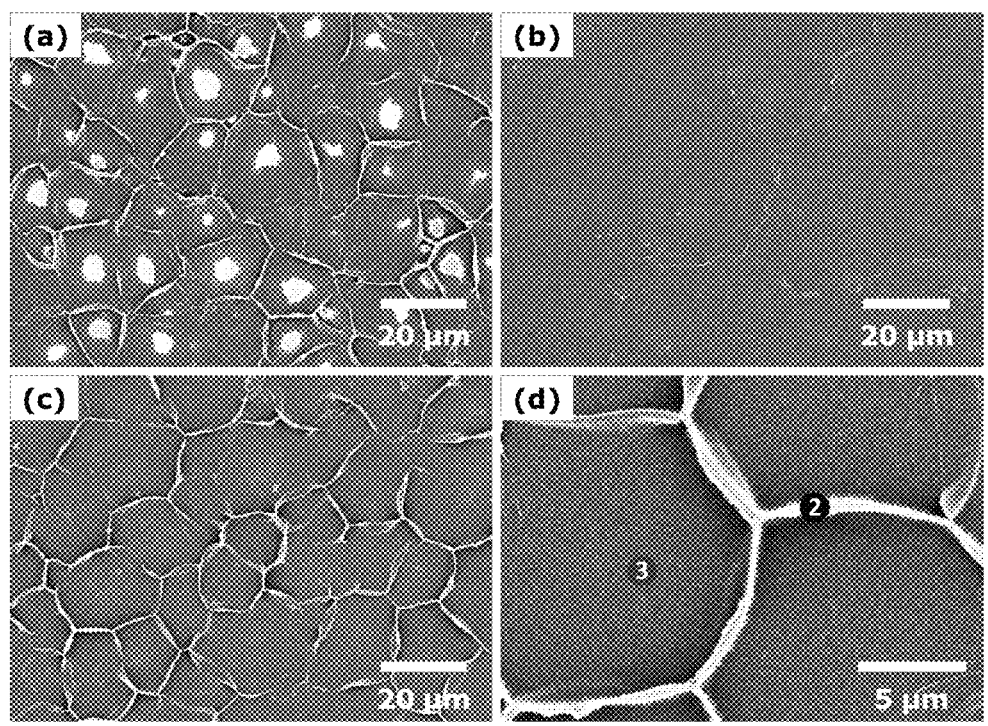
FIG. 3 shows SEM images of the single-walled carbon nanotube film obtained in Example 1 (FIG. 3(c) and FIG. 3(d)), the single-walled carbon nanotube film obtained in Example 2 (FIG. 3(a)), and the single-walled carbon nanotube film obtained in Example 3 (FIG. 3(b)).

The film thus obtained was determined by the SEM and the Raman spectroscopic analysis in a manner similar to the determination of the VA-SWNTs in the step c). FIG. 3(c) and FIG. 3(d) are the SEM images thereof. In addition, the Raman spectroscopic analysis was carried out at each of the portions [2] and [3] in FIG. 3(d). The results thereof are shown by the dashed line [2] and the solid line [3] in FIG. 4.

FIG. 3(c) and FIG. 3(d), in particular, the portion [2] of FIG. 3(d), show that the portion [2] is a portion where the electric conductivity is high, i.e., a portion where the SWNTs are densely present. On the other hand, it shows that the portion [3] is a portion where the electric conductivity is low, i.e., a portion where the SWNTs are sparsely present.

Further, the portions [2] of FIG. 3(c) and FIG. 3(d) show that the portions [2] are continuous to form the pseudo-honeycomb structure on the substrate, namely on the film. It shows that an average length of one side of each of the hexagons of the pseudo-honeycomb structure is about 10 μm.

More, the results of the Raman spectroscopic analysis in FIG. 4 show that the vertical alignment of the VA-SWNTs obtained in the step c) is collapsed in the portions [2] and [3] (the line [1] in FIG. 4 is the results of the Raman spectroscopic analysis). It can be seen that the vertical alignment is collapsed, especially in the portion [3], teaching that the SWNTs are almost in line with the substrate, namely, that the SWNTs are disposed horizontally to the substrate (with regard to the Raman spectroscopic analysis, see Z. Zhang, E. Einarsson, Y. Murakami, Y. Miyauchi and S. Maruyama*, "Polarization dependence of radial breathing mode peaks in resonant Raman spectra of vertically aligned single-walled carbon nanotubes", Phys. Rev. B, (2010), 81, (16), 165442-1-165442-9).

These results show that the carbon nanotube film obtained in the step d) has the dense and the sparse portions of the SWNTs, and that the dense portion forms the pseudo-honeycomb structure on the film.

Further, the electric characteristics of the film thus obtained was determined by the 4-probe method, to be 768 Ω/□.

<<e. A Step of Releasing>>

The carbon nanotube film was released from the one obtained in the step d). The step of releasing was carried out in a manner similar to JP-A No. 2007-182342. That is, distilled water (047-16783, Wako Pure Chemical Industries, Ltd.) was poured into a beaker; and then, it was warmed on a hot plate to 60° C. The one obtained in the step d was stored at room temperature (23° C.), sunk in the warm water in a manner such that the surface formed with the carbon nanotube film became perpendicular to the water surface. As a result, only the carbon nanotube film was released and floated on the water surface.

<<f. A Step of Transferring>>

Figure 5:
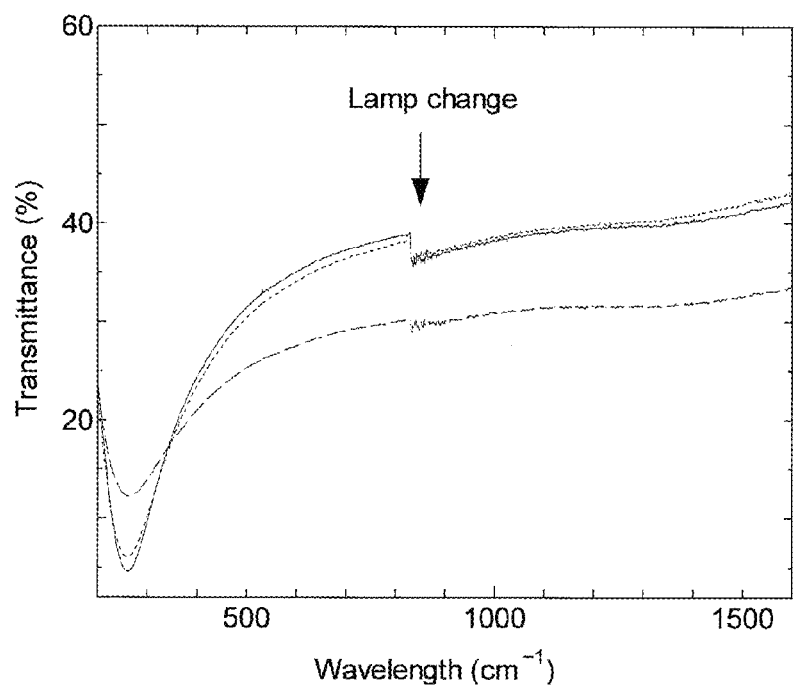
FIG. 5 shows graphs illustrating the transmittances of the UV-visible light in each of the single-walled carbon nanotube films obtained in Examples 1 to 3 (Example 1: the solid line, Example 2: the dashed line, and Example 3: the dotted line).

The carbon nanotube film floating on the water surface, obtained in the step e), was taken out; and then, it was disposed on a quartz substrate, namely, it was transferred thereto. After it was transferred, the optical characteristics thereof were determined. Specifically, the transmittance thereof at the wavelength of 200 to 1600 nm was determined. The results thereof are shown in FIG. 5 (specifically, shown by the solid line in FIG. 5). The results show that the transmittance thereof at 550 nm is 33.5%. Further, with regard to the carbon nanotube film on the quartz substrate obtained in the present step, the Raman spectrophotometric analysis was carried out in a manner similar to the step d). As a result, the same results as the step d) were confirmed although not shown by a figure. That is, it was confirmed that even after the step e) and the step f), there was no change in structure of the film.

Example 2

A carbon nanotube film was prepared in a manner similar to Example 1, except that the temperature of the water in the beaker was changed from 80° C. to 70° C. in the step d of exposing to vapor in Example 1.

The determination of the electric characteristics of the carbon nanotube film thus obtained was carried out by the 4-probe method in a manner similar to the step d of Example 1, giving the result of 2996Ω/□. In addition, the present film was confirmed by SEM in a manner similar to the step d of Example 1. The results are shown in FIG. 3(a).

FIG. 3(a) shows that in the present Example, there are the dense portions and the sparse portions, wherein the pseudo-honeycomb structure is formed by the dense portions. It can be seen that an average length of one side of each of the hexagons of the honeycomb structure is about 10 μm. Furthermore, with regard to the sparse portion, white circles are confirmed in the SEM image, showing that there are portions where the SWNTs are not present.

In addition, the transmittance of the carbon nanotube film disposed on the quartz substrate obtained via the steps e and f in a manner similar to Example 1 was determined in the wavelength of 200 to 1600 nm. The results are shown in FIG. 5 (specifically, shown by the dashed line in FIG. 5). The results show that the transmittance at 550 nm is 26.6%.

Example 3

A carbon nanotube film was prepared in a manner similar to Example 1, except that the exposure time was changed to 15 seconds, and that the temperature of the water in the beaker was kept at 80° C. in the step d of exposing to vapor in Example 1.

The determination of the electric characteristics of the carbon nanotube film thus obtained was carried out by the 4-probe method in a manner similar to the step d of Example 1, giving the result of 1079Ω/□. In addition, the present film was confirmed by SEM in a manner similar to the step d of Example 1. The results are shown in FIG. 3(b).

FIG. 3(b) shows that in the present Example, there are the dense portion and the sparse portion, wherein the pseudo-honeycomb structure is formed by the dense portion. However, an average length of one side of each of the hexagons of the honeycomb structure in the present Example cannot be determined.

The transmittance in the wavelength of 200 to 1600 nm of the carbon nanotube film disposed on the quartz substrate obtained via the steps e and f was determined in a manner similar to Example 1. The results are shown in FIG. 5 (specifically, shown by the dotted line in FIG. 5). The results show that the transmittance at 550 nm is 32.5%.

Only water is required in the step d of exposing to vapor and the step e of releasing in Examples 1 to 3. On the other hand, chemicals such as a surfactant, an organic solution, a super acid and the like, as well as electricity consuming processes such as sonic treatment and vacuum exhaust are not required at all. Accordingly, Examples 1 to 3 can provide the carbon nanotube film to be disposed on the n-type Si substrate conveniently in handling and with a low cost.

With regard to the carbon nanotube film obtained in Examples 1 to 3, conditions employed to make it, in particular, the temperature of water used in the step d of exposing to vapor and the exposure time thereof, the average length of one side of the hexagons of the obtained pseudo-honeycomb structure, the sheet resistance, and the transmittance at 550 nm are summarized in Table 1.

Table 1 shows that the carbon nanotube film obtained in Example 1 is lower in the resistance and higher in the transmittance as compared to those of the film obtained in Examples 2 and 3. It is considered that since the dense portion forms the pseudo-honeycomb structure, and since the pseudo-honeycomb structure is formed in entirety of the film, this acts as the electron carrier high way, resulting in an excellent electric conductivity. Accordingly, it can be seen that the carbon nanotube film obtained in Example 1 is useful as the transparent electrode because of its low sheet resistance and high transparency.

In addition, it can be seen that the carbon nanotube film obtained in Example 2 is higher in the sheet resistance and lower in the transmittance as compared to those of Example 1.

Further, it can be seen that the carbon nanotube film obtained in Example 3 is slightly low in the sheet resistance and comparatively high in the transmittance as compared to those of Example 1.

TABLE 1

Sheet resistance and transmittance at 550 nm in Examples 1 to 3

|  | Water temperature (° C.) | Exposure time (seconds) | Average length of one side of pseudo-honeycomb structure (μm) | Sheet resistance (Ω/□) | Transmittance (%) |
| --- | --- | --- | --- | --- | --- |
| Example 1 | 80 | 5 | 10 | 768 | 33.5 |
| Example 2 | 70 | 5 | 10 | 2996 | 26.6 |
| Example 3 | 80 | 15 | —* | 1079 | 32.5 |

*Unmeasurable

Example 4

<Film Obtained in the Step of Exposing to Ethanol Vapor>

A carbon nanotube film was prepared in a manner similar to Example 1, except that a high purity VA-SWNTs with an average diameter of 2.2 nm and a growth height of 27 μm was formed on the substrate in <<c. A step of forming vertically aligned SWNTs>> of Example 1, that ethanol at the temperature of 60° C. was used in place of water at the temperature of 80° C. used in <<d. A step of exposing to vapor>> of Example 1, and that the exposure time to the ethanol vapor was changed to about 1 second.

The SEM image of the film obtained in the present Example, although not shown in a figure, shows that the present film has the dense portion and the sparse portion of the SWNTs and that the dense portion forms on the substrate the pseudo-honeycomb structure having the hexagons, one side of which has an average length of 25 μm.

Example 5

<Preparation of a Heterojunction Solar Cell>

The film obtained in <<e. A step of releasing>> of Example 1 was used to prepare an n-Si heterojunction solar cell. Specifically, the solar cell was prepared in a manner as shown below:

With regard to the substrate, the substrate having the $SiO_2$ layer (200 nm) on the n-type Si was used.

The substrate was used after treating with 5M NaOH at 90° C. for 60 minute to remove naturally oxidized substances. The series resistance of the silicon was in the range of 7.5 to 13.5Ω.

Then, the silicon was subject to the ultrasonic cleaning by soaking in the RCA2 cleaning solution (mixed solution of $H_2O:HCl:H_2O_2=5:1:1$) for 10 minutes. The silicon was rinsed with the deionized water (pH 7) for several times; and then, the $SiO_2$ layer was sputtered to the thickness of 200 nm to form the bare silicon window with the size of 3 mm×3 mm.

The front contact electrode and the rear contact electrode were made to Pt and Ti/Pt, respectively.

Finally, the film obtained in <<e. A step of releasing>> of Example 1 was disposed on the substrate such that the film covered with the silicon window.

FIG. 6 shows the schematic cross-section view of the solar cell 101 prepared in this Example.

Specifically, the Ti/Pt electrode 103 is formed on one surface (rear surface) of the n-type Si 102. On the other hand, on the surface different from the surface of the Ti/Pt electrode 103, the bare silicon window 104 with the size of 3 mm×3 mm is formed, and the $SiO_2$ layer 105 is formed around the window. On the $SiO_2$ layer 105, the Pt electrode 106 is formed. Further, the film obtained in <<e. A step of releasing>> of Example 1 is disposed such that the film covered with the silicon window 104 and the Pt electrode 106.

The J-V characteristic of the solar cell thus obtained was determined under the standard AM 1.5 and dark condition. The results thereof are shown in FIG. 7.

Figure 7:
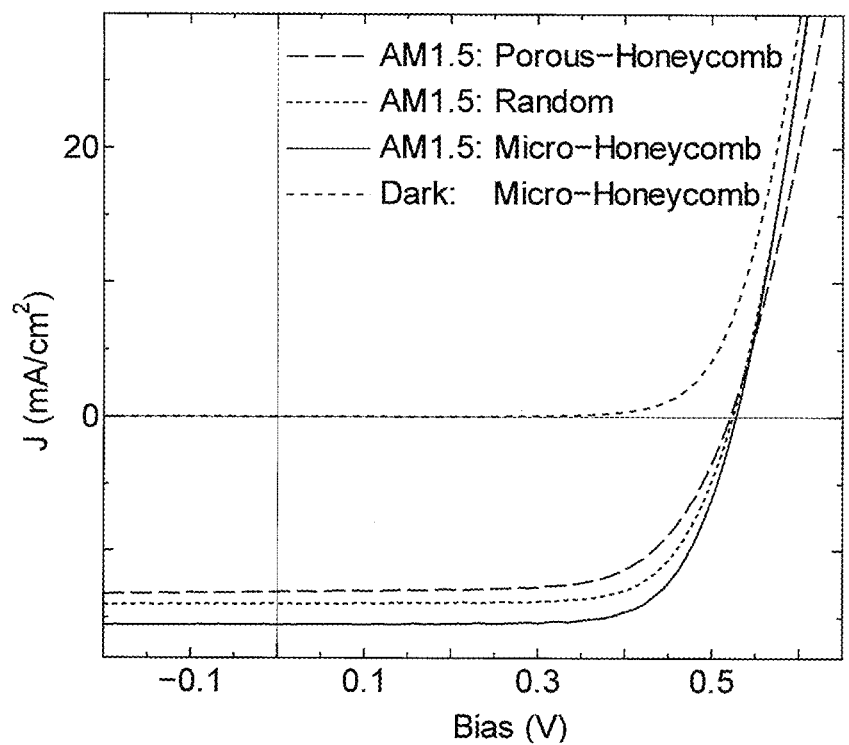
FIG. 7 shows the graphs illustrating the J-V characteristics of the solar cells prepared in Examples 5 to 7.

FIG. 7 shows that the optimum photo conversion efficiency (PCE) of this Example (shown by "AM 1.5: Micro-Honeycomb" in FIG. 7) is 5.91% and the fill factor thereof is 72%. The fill factor is the highest among existing SWNT/n-Si heterojunction solar cells under the condition in which a liquid chemical is not doped.

The open circuit voltage and the short circuit current thereof are 0.53 V and 15.54 mA/cm², respectively.

Example 6

<Preparation of a Heterojunction Solar Cell>

An n-Si heterojunction solar cell was prepared in a manner similar to Example 6, except that the film obtained in Example 2 was used in place of the film used in Example 5, obtained in <<e. A step of releasing>> of Example 1.

The results thereof are shown in FIG. 7 (shown by "AM 1.5: Porous-Honeycomb" in FIG. 7).

Figure 8:
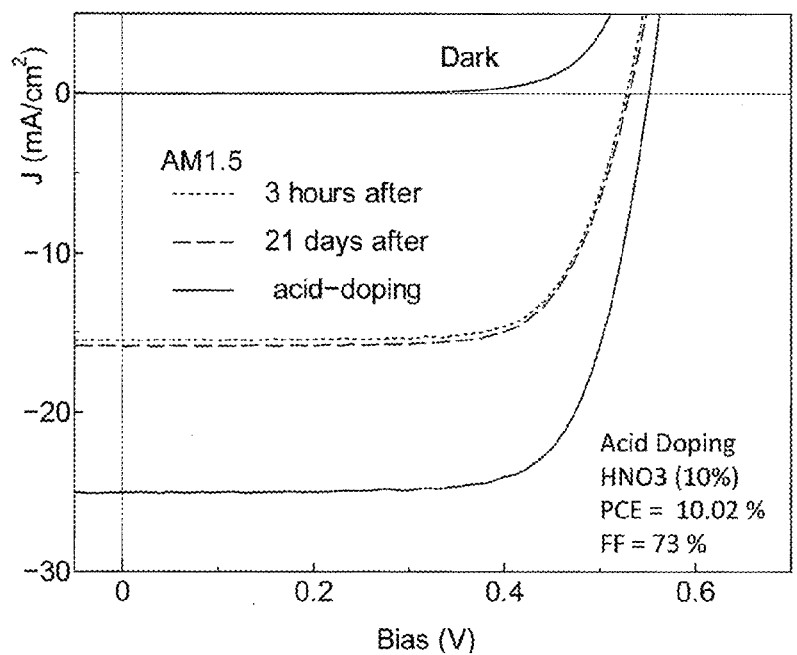
FIG. 8 shows graphs illustrating the J-V characteristics of the solar cells prepared in Examples 8 and 9.

FIG. 8 shows the PCE: 4.71%, the open circuit voltage: 0.52 V, and the short circuit current: 13.27 mA/cm².

Example 7

<Preparation of a Heterojunction Solar Cell>

An n-Si heterojunction solar cell was prepared in a manner similar to Example 5, except that the film obtained in Example 3 was used in place of the film used in Example 5, obtained in <<e. A step of releasing>> of Example 1.

The results thereof are shown in FIG. 7 (shown by "AM 1.5: Random" in FIG. 7).

FIG. 7 shows the PCE: 5.32%, the open circuit voltage: 0.525 V, and the short circuit current: 14.41 mA/cm².

The results of the short circuit currents of Examples 5 to 7 demonstrate that the short circuit current is dependent on Examples 1 to 3, in particular, inversely proportional to the transmittance shown in Table 1 (see, Table 2 shown below). The reason for this is considered that if more photon energies are reached to the SWNT/Si junction surface, more excitons are excited and collected. In Example 5 in which the film of Example 1 was used, each cell of the pseudo-honeycomb structure contains the narrow and homogeneous spaghetti-like nanotube film. It is considered that as compared with usual spaghetti-like nanotubes, many nanotubes in the structure of Example 5 in which the film of Example 1 is used are self-organized in the dense portions, and thus, more photon energies are transferred to the junction surface and are efficiently collected by the dense portions. The fill factor increased with decrease of the sheet resistance. The series resistance of the heterojunction solar cell is affected by the sheet resistance of the SWNTs film and the contact resistance between the SWNT film and the electrode. In the structure of Example 5 in which the film of Example 1 was used, the sheet resistance of the dense SWNTs layer was decreased thereby substantially contributing to increase in the fill factor.

TABLE 2

Sheet resistance, transmittance, and solar cell performances

| | Sheet resistance Ω/□ | Transmittance % | PCE % | Short circuit current mA/cm² | Fill factor % |
|---|---|---|---|---|---|
| Example 5 | 768 | 33.5 | 5.91 | 15.5 | 72 |
| Example 6 | 2996 | 26.6 | 4.71 | 13.3 | 68 |
| Example 7 | 1079 | 32.5 | 5.32 | 14.4 | 70 |

Example 8

With regard to the solar cell obtained in Example 5, the cell properties thereof were determined when 21 days were passed from the preparation. As a result, it was found that the PCE: 6.04%, the open circuit voltage: 0.53 V, and the short circuit current: 15.9 mA/cm². Furthermore, the results of the J-V characteristic of the solar cell of the present Example are shown in FIG. 8 (21 days after).

As a result, even though 21 days are passed from the preparation, the solar cell performance was not deteriorated, or even improved in comparison with the performance was determined immediately after the preparation, teaching that the solar cell of Example 5 is stable for a long period of time.

Example 9

<HNO₃ Doping>

With regard to the solar cell obtained in Example 5, the film obtained in Example 1 was doped with HNO₃ to obtain a solar cell. Then, the J-V characteristic thereof was determined.

Specifically, after the solar cell obtained in Example 5 was heated to 50° C., 120 μL of 10% HNO₃ was added to the film in the solar cell, the cell being obtained in Example 1, followed by drying, to obtain the solar cell of the present Example.

The results of the J-V characteristic of the solar cell of the present Example are shown in FIG. 8 (shown by "acid-doping"). The results show that the PCE: 10.0%, the open circuit voltage: 0.55 V, and the short circuit current: 25.01 mA/cm².

Accordingly, it can be seen that the performance of the solar cell of the present Example obtained by doping with HNO₃ followed by drying is almost in a practical level.

Example 10

<A Dye-Sensitized Solar Cell>

The film obtained in Example 4 was used to prepare a dye-sensitized solar cell (DSSC). Specifically, the film obtained in Example 4 was used as the counter electrode. FIG. 9 shows the schematic view of the DSSC 201 fabricated in the present Example. The DSSC 201 is configured by the photoelectrode 202, the electrolyte solution 205, and the counter electrode 206.

The photoelectrode 202 is configured by the fluorine-doped tin oxide (FTO) glass 203 and the nanocrystalline TiO₂ particle layer 204 with the thickness of 10 nm. The photoelectrode was heated to 450° C. and annealed for 30 minutes in an air. Thereafter, it was soaked in the 0.3 mM N719 ethanol solution for 24 hours. Then, the electrode incorporated with N719 (dye) was carefully rinsed with ethanol.

The counter electrode 206 is usually configured by the FTO glass and the sputtered Pt; however, in the dye-sensitized solar cell according to the present invention, the film 207 which was obtained in Example 4 was used in place of Pt. That is, the counter electrode 206 is configured by the FTO glass 208 and the film 207 on the side of the electrolyte 205, the film being obtained in Example 4.

And also, for comparison with the present Example, (i) the DSSC using the sputtered Pt as usual and (ii) the DSSC using the VA-SWNTs film prepared before <<A step of exposing to ethanol vapor>> of Example 4 were prepared.

Figure 10:
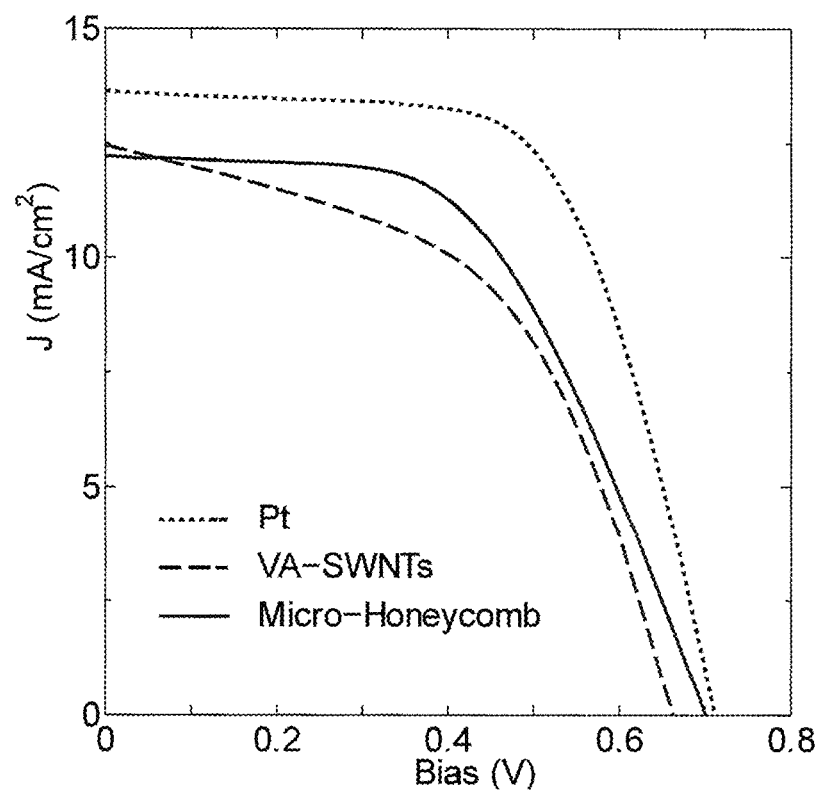
FIG. 10 shows graphs illustrating the J-V characteristics of the dye-sensitized solar cell 201 prepared in Example 10 in comparison with the dye-sensitized solar cell prepared for comparison.

With regard to the DSSC of the present Example, (i) the DSSC using the sputtered Pt, and (ii) the DSSC using the VA-SWNTs film prepared before <<A step of exposing to ethanol vapor>> of Example 4, the J-V characteristics thereof under the standard condition with AM 1.5 were determined. The results of them are shown in FIG. 10.

The DSSC using the counter electrode according to the present Example (shown by "micro-Honeycomb" in FIG. 10) shows that the PCE is 4.64% at AM 1.5 and the fill factor is 54%. The open circuit voltage and the short circuit current are 0.70 V and 12.24 mA/cm², respectively. The results show improvement of 10% relative to 4.20% CPE of (ii) the DSSC using the VA-SWNTs film as the counter electrode (shown by "VA-SWNTs" in FIG. 10).

What is claimed is:

1. A method for producing a film comprising single-walled carbon nanotubes, the film comprising a dense portion where the single-walled carbon nanotubes are densely present and a sparse portion where the single-walled carbon nanotubes are sparsely present, the method comprising the steps of:
    A) preparing a layer comprising vertically aligned single-walled carbon nanotubes formed on a substrate; and
    B) exposing a surface of the layer comprising the single-walled carbon nanotubes to at least one vapor selected from the group consisting of water and lower alcohols, to form the dense portion where the single-walled carbon nanotubes are densely present and the sparse portion where the single-walled carbon nanotubes are sparsely present, therefrom by the dense portion to form a pseudo-honeycomb structure on the layer comprising the single-walled carbon nanotubes,
    wherein the dense portion has single-walled carbon nanotubes, an axis direction of each of which is aligned vertically to the film.

2. The method according to claim 1, further comprising a step of C) soaking a resultant one in the step B) in water at a temperature of 60 to 100° C., to release the layer comprising the single-walled carbon nanotubes from the substrate, thereby to form the film from the released layer.

3. A method for producing a material having a film comprising single-walled carbon nanotubes, the film comprising a dense portion where single-walled carbon nanotubes are densely present and a sparse portion where single-walled carbon nanotubes are sparsely present, the method comprising the steps of:
    A) preparing a layer comprising vertically aligned single-walled carbon nanotubes formed on a substrate;
    B) exposing a surface of the layer comprising the single-walled carbon nanotubes to at least one vapor selected from the group consisting of water and lower alcohols, to form the dense portion where the single-walled carbon nanotubes are densely present and the sparse portion where the single-walled carbon nanotubes are sparsely present, therefrom by the dense portion to form a pseudo-honeycomb structure on the layer comprising the single-walled carbon nanotubes;
    C) soaking a resultant one in the step B) in water at a temperature of 60 to 100° C., to release the layer comprising the single-walled carbon nanotubes from the substrate, thereby to form the film from the released layer; and
    D) disposing the film obtained in the step C) in a predetermined position,
    wherein the dense portion has single-walled carbon nanotubes, an axis direction of each of which is aligned vertically to the film.

4. The method according to claim 3, wherein the material is a solar cell.

* * * * *